POWER AMPLIFIER INCLUDING PLURALITY OF TRANSISTORS OPERATING IN PARALLEL

Filed Oct. 13, 1966

Inventor
LARRY R. WRIGHT
By Mueller, Aichele & Rauner
ATTYS.

3,471,796

POWER AMPLIFIER INCLUDING PLURALITY OF TRANSISTORS OPERATING IN PARALLEL

Larry R. Wright, Franklin Park, Ill., assignor to Motorola, Inc., Franklin Park, Ill., a corporation of Illinois Filed Oct. 13, 1966, Ser. No. 586,540
Int. Cl. H03f 3/68
U.S. Cl. 330—30 9 Claims

ABSTRACT OF THE DISCLOSURE

Power amplifier for radio transmitter or the like including plurality of transistors operating in parallel. Individual input and output matching networks are provided for each transistor, and at least one corresponding electrode of all of the transistors are interconnected by impedances so that the signals in all the transistors are substantially identical. The interconnection may be provided by resistors connected to the collector electrodes of the transistors, and/or by resistors connected to the base electrodes thereof.

Figures 1, 2:
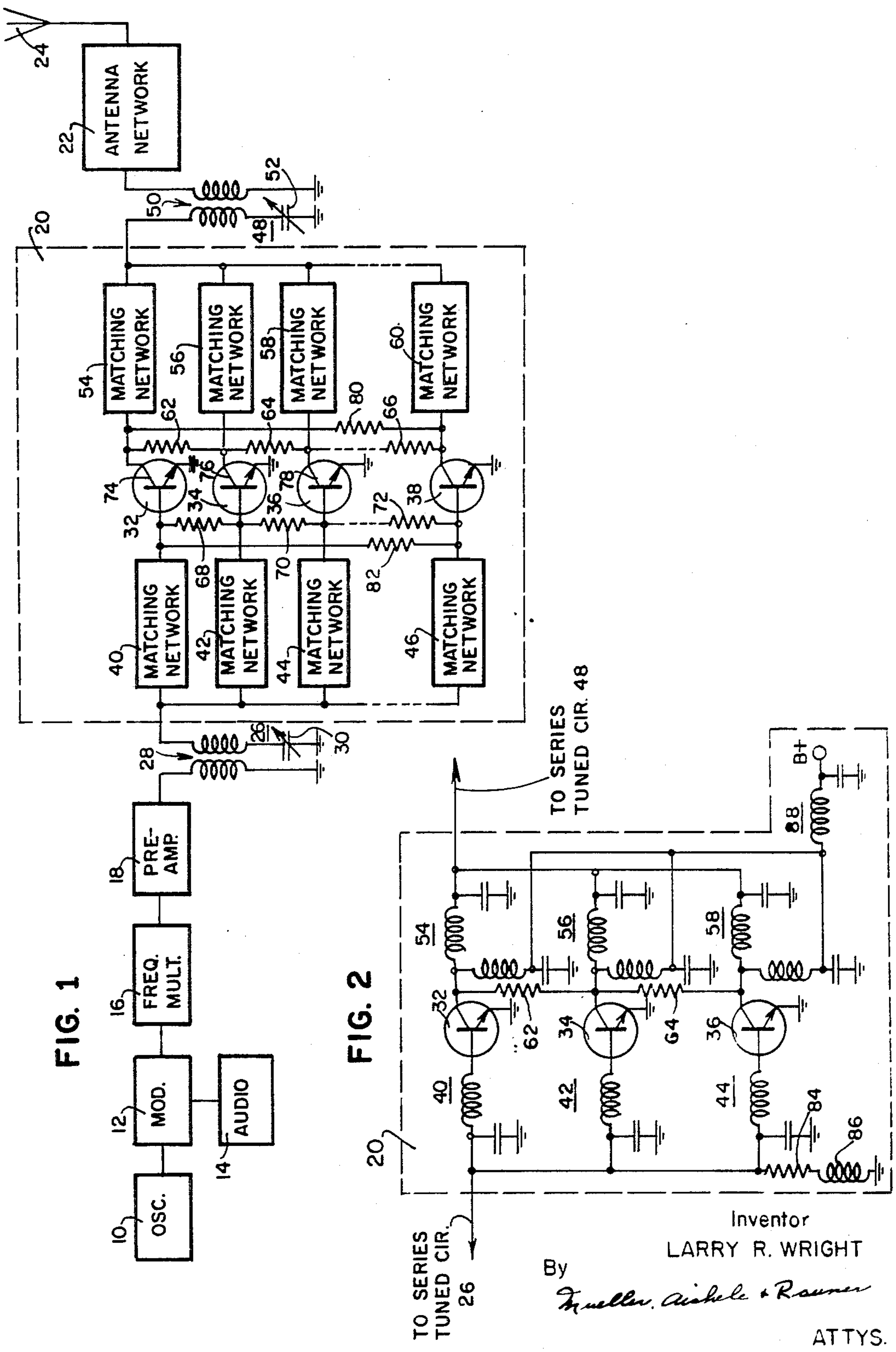

This invention relates to a power amplifier having a plurality of transistors with means to equalize the power distribution among the transistors and to insure balanced operation thereof.

The power amplifier section of the transmitter may use a number of transistors connected in parallel to provide the desired high powered output. In order to insure maximum efficiency, the input impedance of each transistor must be matched with the impedance of the driving source while the output impedance of each transistor must be matched to the output load which, for example, may be a 50 ohm antenna. In the past, corresponding electrodes of the transistors have been connected together with the input electrodes being coupled to the driving source by matching circuitry and the output electrodes similarly coupled to the output load. This has made matching difficult when the transistors have low impedances due to the high frequencies at which they are driven and when connected in parallel the combination has an even lower impedance. The resulting large impedance step-ups and step-downs made selection of the matching circuitry components critical and any small mismatch would result in loss in overall efficiency.

It is, therefore, an object of this invention to simplify the matching requirements and improve the efficiency of a power amplifier comprising a plurality of transistors by separately matching each transistor to its driving source and to its output load.

An additional problem which may arise when the corresponding electrodes are connected together results from the fact that the characteristics of the transistors are not precisely the same so that some of the transistors may be taxed beyond their capabilities while others may not be operating at maximum capacity. Also, the method of intercoupling the transistors in prior art power amplifiers created the possibility that the transistors would be driven into undesirable modes of operation such as push-pull oscillations.

It is, therefore, another object of this invention to equalize the power distribution among the transistors and to insure balanced operation thereof.

In the drawings:

FIG. 1 illustrates a diagram partially schematic and partially in block of a transmitter incorporating the invention; and FIG. 2 illustrates a specific embodiment of the power amplifier of FIG. 1.

In practicing the invention, a power amplifier comprising a plurality of transistors is utilized in a signal translating system. A separate impedance matching network is connected to the input electrode of each transistor in order to match the transistors to the previous stages. Further matching networks are separately connected to each output electrode for matching the transistors to an output circuit which may, for example, be an antenna network. An impedance is connected from one of the electrodes of each transistor to a corresponding electrode of another transistor which cooperates with the separate matching networks to limit the tendency of the transistors to be driven into an unbalanced mode of operation and to cause substantially equal power distribution among the transistors. In a balanced condition, signals on corresponding electrodes will follow one another so that there is no degenerative effect while in an unbalanced mode there will be a voltage drop across one or more of the impedances thereby causing the power amplifier to return to a balanced condition.

Referring now to the drawing, there is shown a frequency modulation transmitter incorporating the invention hereinafter described. Signals from the oscillator 10 are modulated by signals from audio circuit 14 in modulator 12. After the frequency and deviation of the carrier wave in increased by frequency multiplier 16, the signal is amplified by preamplifier 18 and power amplifier 20 and coupled through antenna network 22 to antenna 24 for radiation of the developed signal.

Signals from preamplifier 18 appear across a series tuned circuit 26 comprising the secondary winding of the transformer 28 and a tuning capacitor 30. Power amplifier 20 includes transistors 32, 34, 36 and 38 with the dotted lines on the circuitry associated with transistor 38 indicating the fact that any number of transistors may be utilized. Each of the transistors has a low impedance, of the order of 9 ohms, due partially to the high frequency at which they are driven. If the bases of the transistors were connected together, the input impedance would be 9 ohms divided by the number of transistors used and since the impedance of series tuned circuit 26 is generally much higher, accurate matching circuitry is required to provide maximum power transfer with any slight mismatch resulting in an overall loss in efficiency. To simplify the matching requirements, the tuned circuit 26 is matched into the full impedance of each transistor by utilizing separate matching circuits 40–46.

Since the transistors may not have the same characteristics which fact is further accentuated by the low input impedance when the transistors are connected together, one of the transistors may tend to draw less of the input power so that it is not operated at its maximum capability thereby resulting in a decrease in the overall efficiency. In addition, the other transistors may be taxed beyond their power capabilities so that they may burn out. To overcome this, separate matching networks 40–46 are coupled between each transistor base and the series tuned circuit 26. Now if transistor 32, for example, attempts to draw more than its share of the input power, the voltage across its matching network 40 would increase thereby limiting the power available for transistor 32. At the same time the remaining transistors 34, 36 and 38 are more able to receive the proper amount of power.

A similar problem presents itself in the output circuit where the amplified signals are developed across a series tuned circuit 48 including the primary winding of the transformer 50 and its tuning capacitor 52. This circuit also has a relatively high impedance which must be matched to the relatively low output impedances of the transistors. By separately matching each transistor collector to the load, a small step-up is reuired thereby making the values of the components in matching networks 54–60 less critical.

In addition, if the collectors were connected together, one of the transistors may supply more than its share of the output power so that it may be taxed beyond its capabilities with the remaining transistors supplying less than their share thereby causing a decrease in efficiency of the power amplifier. Matching networks 54–60 provide an even distribution of the power in a fashion similar to that explained with respect to the base circuits.

In order to simplify the alignment procedure and to provide further assurance that each transistor will not be taxed beyond its maximum power capabilities, resistors 62–72 are connected as shown which cooperate with the separate matching networks to cause relatively equal power distribution. When a transistor tends to consume and/or supply more than its share of the power, its associated resistor will cause a decrease in the power in that transistor.

An additional reason for the resistors is to protect the power amplifier from being driven into unbalanced modes which may result from the differences in transistor characteristics so that the signal on any one base or collector may be of a different phase and/or amplitude than that on another corresponding electrode. How the resistors alleviate this problem may be explained by reference to one of the resistors 62 which is connected from collector 74 of transistor 32 to collector 76 of transistor 34. If, due to differences in transistor characteristics, the signal on collector 74 is different than the signal on collector 76, either in phase or in amplitude, there will be a potential difference across resistor 62. The current flow through resistor 62 causes dissipation of some of the output power developed to thereby degenerate the transistor producing the higher amplitude signal. Thus, the phases and amplitudes of the signals on collectors 74 and 76 will track one another to insure balanced operation. Similarly, resistor 64 is connected as shown to cause the signals on collectors 76 and 78 to follow one another. There will be further resistors as represented by resistor 66 depending on the number of transistors. During normal operation where there is no unbalance, the resistors will dissipate no power since the signals on the collectors are the same.

Since the same problems with respect to the differences in transistor characteristics may occur with respect to the transistor input impedances, resistors 68 to 72 may be used to interconnected the bases for the same purpose and in the same manner as explained with reference to the collectors. It is also possible that certain transistors may be subject to variations only in the input impedance in which case the base resistors alone may be employed. Additional resistors 80 and 82 may be inserted as shown in order to provide additional protection against unbalance. It should be understood that although four or more transistors are shown, the use of two or three transistors will also come within the scope of this invention.

FIG. 2 shows a specific embodiment of the power amplifier 20 shown generally in FIG. 1. Elements common to both figures have the same reference numerals. Matching networks 40–44 and 54–58 are illustrative of what may be used in the corresponding blocks of FIG. 1. A network comprising resistor 84 and inductor 86 connected between the junction of the three input matching networks to a point of reference potential provides means to bias the transistors into Class C operation. B+ for the transistors is provided through an RF decoupling network 88 through one of the coils in each of the output matching networks to the respective collectors. As shown, only three transistors are employed thereby requiring only two resistors, 62 and 64. The operation of this circuit is similar to the more generic operation explained with respect to FIG. 1 except that no resistors appear in the base circuits. Such an embodiment may be useful where the transistors' input characteristics are not very different from one another or the differences are small enough not to degrade operation of the power amplifier.

What has been described, therefore, is a power amplifier which utilizes a number of low power transistors in order to develop a high power output combined with additional circuitry to provide maximum efficiency without driving the power amplifier into unbalanced modes of operation.

I claim:

1. In a signal translating system having signal providing means for supplying input power of a given magnitude and signal utilization means for processing output power of an increased magnitude, a power amplifier including in combination; a plurality of intercoupled transistors each having input and output electrodes and input and output impedances, a plurality of first impedance matching networks each connected to said signal providing means and to separate ones of said input electrodes for matching the signal providing means to the full input impedance of each transistor, a plurality of output impedance matching networks connected to said signal utilization means and to separate ones of said output electrodes for matching the signal utilization means to the full output impedance of each transistor, impedance means connected between one of said electrodes of one of said transistors and a corresponding electrode of each of the other ones of said transistors for causing signals in all of said transistors to be substantially identical for balanced parallel operation of said transistors, said impedance matching networks cooperating with said impedance means to insure that each transistor provides a substantially equal portion of the output power.

2. The signal translating system according to claim 1 wherein said input electrode of each transistor is a base electrode and said output electrode thereof is a collector electrode, and wherein said impedance means includes resistor means connected to said collector electrodes of all of said transistors.

3. The signal translating system according to claim 1, said power amplifier including three transistors, said input electrode of each transistor being a base electrode and said output electrode thereof being a collector electrode, and said impedance means including a plurality of resistors connected to said collector electrodes.

4. The signal translating system according to claim 1, said power amplifier including first, second and third transistors, said input electrode of each transistor being a base electrode and said output electrode thereof being a collector electrode, said impedance means comprising first and second resistors, said first resistor connected between the collector electrodes of said first and second transistors, and said second resistor connected between the collector electrodes of said second and third transistors.

5. The signal translating system according to claim 1, said power amplifier including first, second and third transistors, said input electrode of each transistor being a base electrode and said output electrode thereof being a collector electrode, said impedance means comprising first and second resistors, said first resistor connected between the base electrodes of said first and second transistors, said second resistor being connected between the base electrodes of said second and third transistors.

6. The signal translating system according to claim 1, said power amplifier including first, second and third transistors, said input electrode of each transistor being a base electrode and said output electrode thereof being a collector electrode, said impedance means comprising first and second resistors, said first resistor connected between the collector electrodes of said first and second transistors, said second resistor connected between the collector electrodes of said second and third transistors, said signal amplifier further including third and fourth resistors, said third resistor connected between the base electrodes of said first and second transistors, said fourth resistor connected between the base electrodes of said second and third transistors.

7. A power amplifier for converting input power of a given magnitude into output power of an increased magnitude, including the combination of; a plurality of transistors each having input and output electrodes, an input circuit including an input conductor and a plurality of input impedance networks each connecting said conductor to a separate one of said input electrodes for applying input signals thereto, an output circuit including an output conductor and a plurality of output impedance networks each connected from a separate one of said output electrodes to said output conductor, and impedance means connected between one set of corresponding electrodes of all of said transistors for causing the signals in said transistors to be substantially the same, said impedance means cooperating with said impedance networks to cause said transistors to provide substantially equal portions of the output power and to insure balanced operation of said power amplifier.

8. The power amplifier according to claim 7 including first, second and third transistors, said input electrode of each transistor being a base electrode and said output electrode thereof being a collector electrode, said impedance means comprising first and second resistors, said first resistor connected between the collector electrode of said first and second transistors, said second resistor connected between the collector electrodes of said second and third transistors.

9. The power amplifier according to claim 7 wherein said transistors include first, second and third transistors, with said input electrode of each transistor being a base electrode and said output electrode thereof being a collector electrode, and wherein said impedance means includes a plurality of resistors connected between said collector electrodes of said transistors.

References Cited

UNITED STATES PATENTS

| | | | |
|---|---|---|---|
| 3,345,578 | 10/1967 | Shuda ------------ | 330—30 X |
| 3,360,739 | 12/1967 | Cooke-Yarborough -- | 330—124 |

ROY LAKE, Primary Examiner

LAWRENCE J. DAHL, Assistant Examiner

U.S. Cl. X.R.

330—31